(12) United States Patent
Chang

(10) Patent No.: US 11,439,004 B1
(45) Date of Patent: Sep. 6, 2022

(54) DURABLE MEMORY DEVICE

(71) Applicant: TEAM GROUP INC., New Taipei (TW)

(72) Inventor: Chin Feng Chang, New Taipei (TW)

(73) Assignee: TEAM GROUP INC., New Taipei (TW)

( * ) Notice: Subject to any disclaimer, the term of this patent is extended or adjusted under 35 U.S.C. 154(b) by 28 days.

(21) Appl. No.: 17/231,978

(22) Filed: Apr. 15, 2021

(30) Foreign Application Priority Data

Feb. 18, 2021 (TW) ................. 110105510

(51) Int. Cl.
*H05K 1/02* (2006.01)
*H05K 1/11* (2006.01)
*H02H 9/04* (2006.01)
*H05K 1/18* (2006.01)

(52) U.S. Cl.
CPC ........... *H05K 1/0257* (2013.01); *H02H 9/045* (2013.01); *H05K 1/0227* (2013.01); *H05K 1/115* (2013.01); *H05K 1/18* (2013.01); *H05K 2201/0715* (2013.01); *H05K 2201/093* (2013.01); *H05K 2201/10015* (2013.01); *H05K 2201/10022* (2013.01); *H05K 2201/10166* (2013.01)

(58) Field of Classification Search
CPC ...... H05K 1/0257; H05K 1/0227; H05K 1/18; H05K 2201/10015; H05K 2201/10022
See application file for complete search history.

(56) References Cited

U.S. PATENT DOCUMENTS

| 5,831,890 | A  | * | 11/1998 | Selna  | G11C 5/147 365/51 |
| 10,440,818 | B1 | * | 10/2019 | Chan   | H05K 1/056 |
| 2011/0222252 | A1 | * | 9/2011 | Chen   | H01L 24/75 361/760 |
| 2018/0081554 | A1 | * | 3/2018 | Iyer   | G11C 8/12 |
| 2021/0132856 | A1 | * | 5/2021 | Chen   | G06F 3/061 |

* cited by examiner

*Primary Examiner* — Sherman Ng
(74) *Attorney, Agent, or Firm* — Maschoff Brennan

(57) ABSTRACT

Disclosed is a durable memory device comprising: a multilayer PCB having a plurality of circuit layers and a plurality of circuit layers insulating layers alternately arranged with each other, ach circuit layer being provided with a via through which the plurality of circuit layers are electrically connected, and the circuit layers has at least one ground layer; a memory member; a connection interface for connecting to a corresponding connecting portion of a computing device; and an anti-sulfuration-and-anti-high-voltage passive component which is disposed at the multilayer PCB and electrically connected to the connection interface and the memory member. By combining the anti-sulfuration-and-anti-high-voltage passive component and multilayer PCB, the durable memory device of the present invention is durable for the outdoor use.

9 Claims, 4 Drawing Sheets

DURABLE MEMORY DEVICE

FIELD OF THE INVENTION

The present invention relates to a memory storage device, and more particularly relates to a durable memory device.

BACKGROUND OF THE INVENTION

A memory storage device is an essential component for a computing device. The memory storage device stores or temporarily holds digital data of the computing device for quickly data access. The memory storage devices could be classified including DRAM module, i.e., UDIMM, RDIMM, SODIMM, and flash module, i.e., solid-state drive. With the miniaturization of the computing devices, a memory storage device becomes more utilized in outdoor places, where a memory storage device is risky to contact sulfur compounds and water molecules in the air. As a result, the lifespan of the memory storage devices is shortened. Furthermore, in outdoor places, in addition to the risk of sulfuration and water molecules, a memory storage device may be damaged by high-voltage surges generated by lightning and static electricity, which cause the component failure.

For solving the above, some prior solid-state drives of the memory storage devices apply an anti-sulfurization passive component such as an anti-sulfurization resistor, whose electrical terminals are changed to anti-sulfurization material. Moreover the structure of the resistors is also improved in a manner that a conductive path between electrical terminals is changed from a straight path to a winding path to resist high-voltage surges. However, for the solid-state drives, a memory storage device only having the above anti-vulcanization and anti-high-pressure-surges resistor is still not sufficient to cope with outdoor circumstances.

SUMMARY OF THE INVENTION

Accordingly, one objective of the present invention is to provide a durable memory device, which has protective effect against high-voltage surges.

In order to overcome the technical problems in prior art, the present invention provides an durable memory device, which is a main memory or a solid-state drive, the durable memory device comprising: a multilayer PCB including a plurality of circuit layers and a plurality of insulating layers, each circuit layer and each insulating layer being alternately arranged with each other, each circuit layer being provided with a via through which the plurality of circuit layers are electrically connected, at least one of the circuit layers being functioned as a ground layer; a memory member which is disposed at the multilayer PCB; a connecting interface which is disposed at the multilayer PCB and is electrically connected to the memory member, the connecting interface being provided to connect to a corresponding connecting portion of a computing device; and an anti-sulfuration-and-anti-high-voltage passive component which is disposed at the multilayer PCB and is electrically connected to the memory member and the connecting interface, wherein a winding conductive path is provided to electrically connect between electrical terminals of the anti-sulfuration-and-anti-high-voltage passive component.

In one embodiment of the present invention, the anti-sulfuration-and-anti-high-voltage passive component is an anti-sulfuration-and-anti-high-voltage resistor.

In one embodiment of the present invention, the multilayer PCB is an eight-layer PCB or a ten-layer PCB.

In one embodiment of the present invention, the ground layer of the multilayer PCB includes a power ground, the anti-sulfuration-and-anti-high-voltage passive component is electrically connected to the power ground.

In one embodiment of the present invention, the ground layer of the multilayer PCB includes an analog ground and a common ground, the power ground is electrically connected to the common ground through at least one via of the vias, the analog ground is electrically connected to the common ground through via of the vias other than said at least one via.

In one embodiment of the present invention, further comprising an anti-high-voltage capacitor, which is disposed at the multilayer PCB and is electrically connected to the connecting interface and the memory member.

In one embodiment of the present invention, the number of the anti-sulfuration-and-anti-high-voltage passive component is more than one.

In one embodiment of the present invention, the durable memory device is a main memory.

In one embodiment of the present invention, the durable memory device is a solid-state drive.

The technical means adopted by the present invention is to mount the anti-vulcanization-and-anti-high-voltage passive components on multilayer PCB. The anti-sulfuration-and-anti-high-voltage passive component is modified based on the anti-sulfurization passive component, which alters its conductive path between the electrical terminals from a straight path to a winding path, so as to extend the length of the conductive path between the electrical terminals to obtain a slight inclined potential energy along the path to avoid the damage caused by high-voltage surges to the anti-vulcanization-and-anti-high-voltage passive component. In addition to the ability to resist high-voltage surges, the structure of multilayer PCB could disperse wirings across these multiple layers so as to obtain more distance between the circuits to reduce the risk of mutual interference and electric-conduction. The multilayer PCB also has ground layers, which provide with good conductivity and shielding ability. Moreover, the ground layers could also absorb and shield excessive high-voltage surges. Therefore, the multilayer design of the multilayer PCB in combination of the characteristic features of anti-vulcanization-and-anti-high-voltage passive component could further improve the ability to resist high-voltage surges. As a result, the memory device of the present invention is more durable for outdoor use.

DETAILED DESCRIPTION OF THE PREFERRED EMBODIMENTS

The preferred embodiments of the present invention are described in detail below with reference to FIG. 1 to FIG. 4.

The description is used for explaining the embodiments of the present invention only, but not for limiting the scope of the claims.

Figure 1:
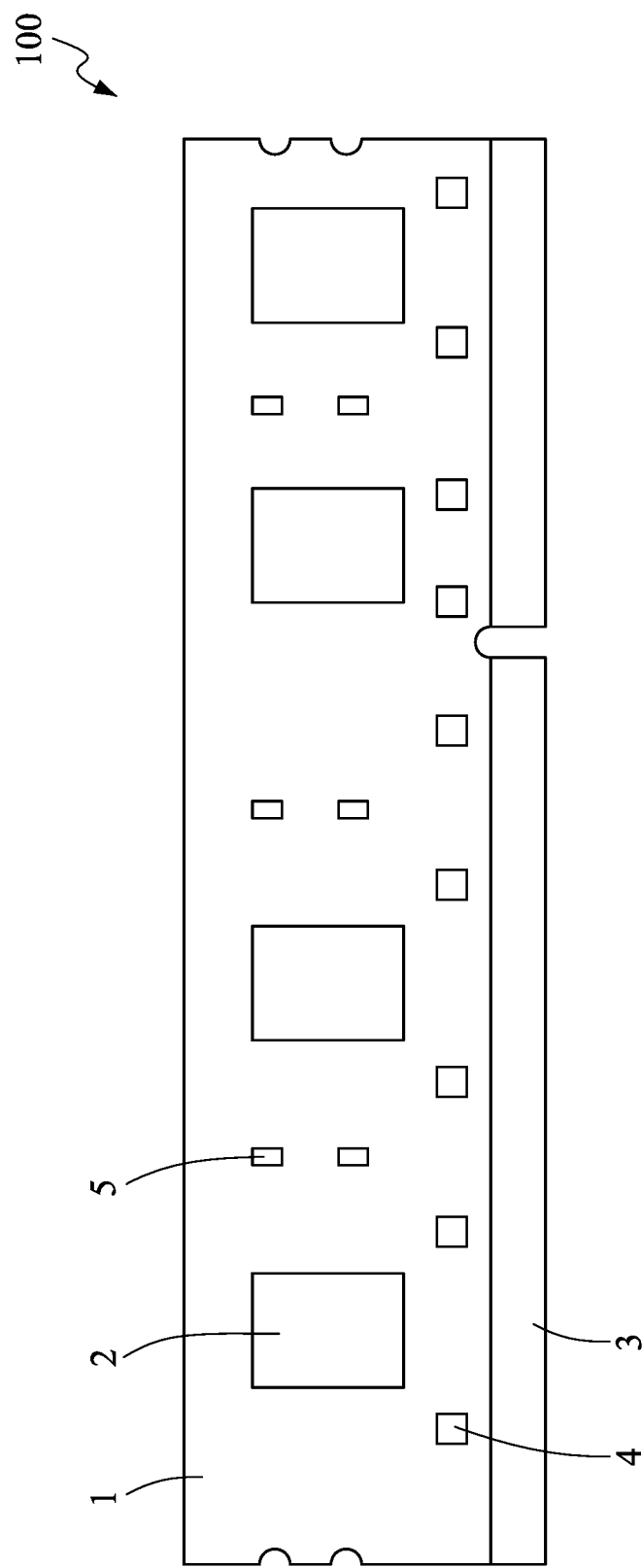
FIG. 1 is a schematic top view illustrating a durable memory device according to one embodiment of the present invention.

As shown in FIG. 1, a durable memory device 100 according to one embodiment of the present invention includes: a multilayer PCB 1, a memory member 2, a connecting interface 3, and an anti-sulfuration-and-anti-high-voltage passive component 4.

The durable memory device 100 can be a main memory such as an unbuffered dual in-line memory module (UDIMM), a registered dual in-line memory module (RDIMM), a small outline dual in-line memory module (SODIMM), or a solid-state drive.

Figure 2:
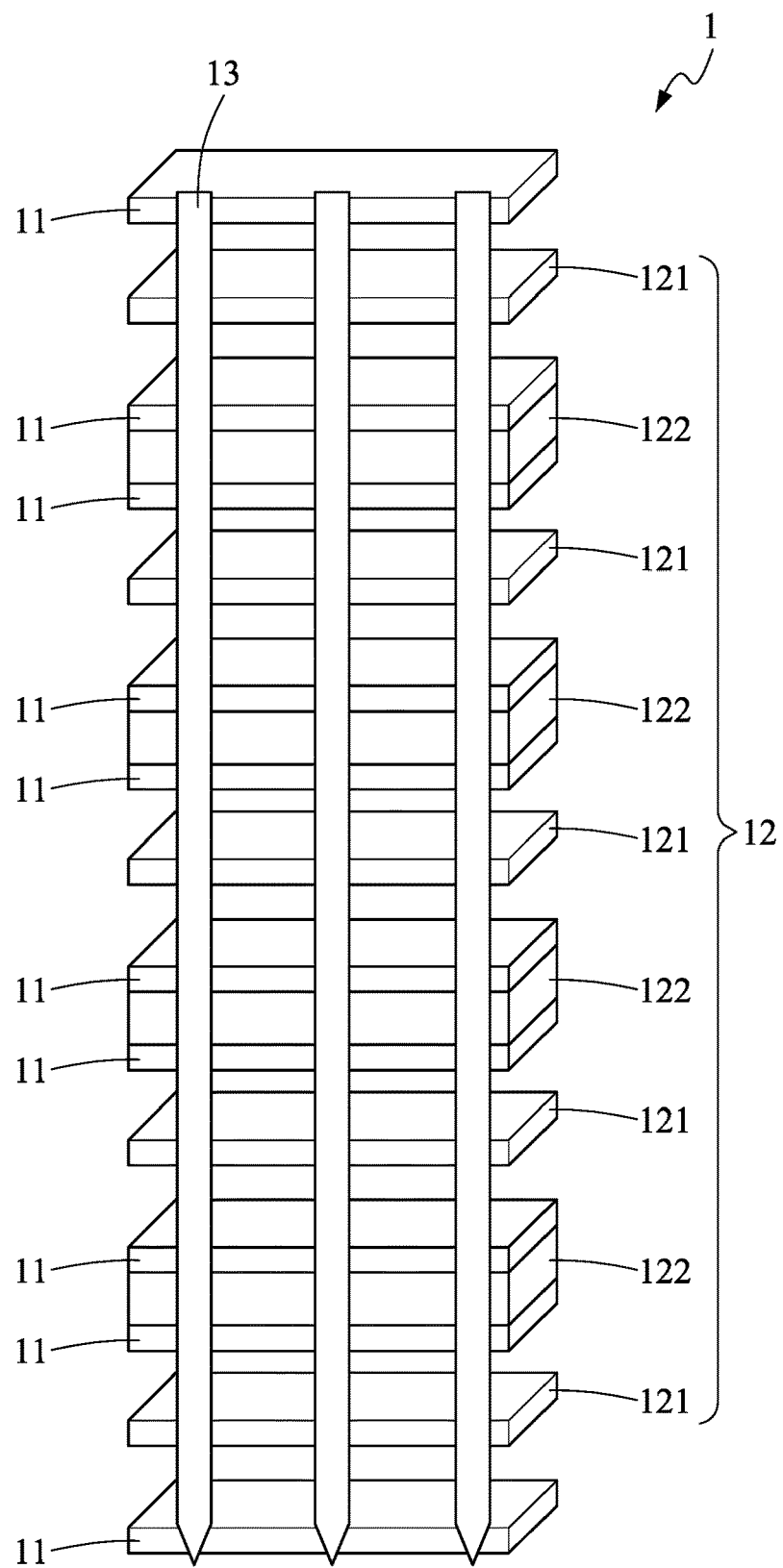
FIG. 2 is a schematic side view illustrating the durable memory device according to the embodiment of the present invention.

As shown in FIG. 2, in the durable memory device 100 according to the embodiment of the present invention, the multilayer PCB 1 has a plurality of circuit layers 11 and a plurality of insulating layers 12. Each circuit layer 11 and each insulating layer 12 are alternately arranged with each other. The thickness of each insulating layer 12 is larger than the thickness of each circuit layer 12. Each circuit layer 11 is provided with a via 13 through which the plurality of circuit layers 11 are electrically connected. At least one of the circuit layers 11 is functioned as a ground layer;

As shown in FIG. 2, in the present embodiment, the multilayer PCB 1 is a ten-layer PCB with ten circuit layers 11 and nine insulating layers 12. It goes without saying that the multilayer PCB 1 also can be an eight-layer PCB or a multilayer PCB with other even number of layers. The multilayer PCB 1 enables the wiring to be dispersed across multiple layers to put some distance between the circuits, and thus the chance of mutual interference and electric-conduction is reduced.

Figure 3:
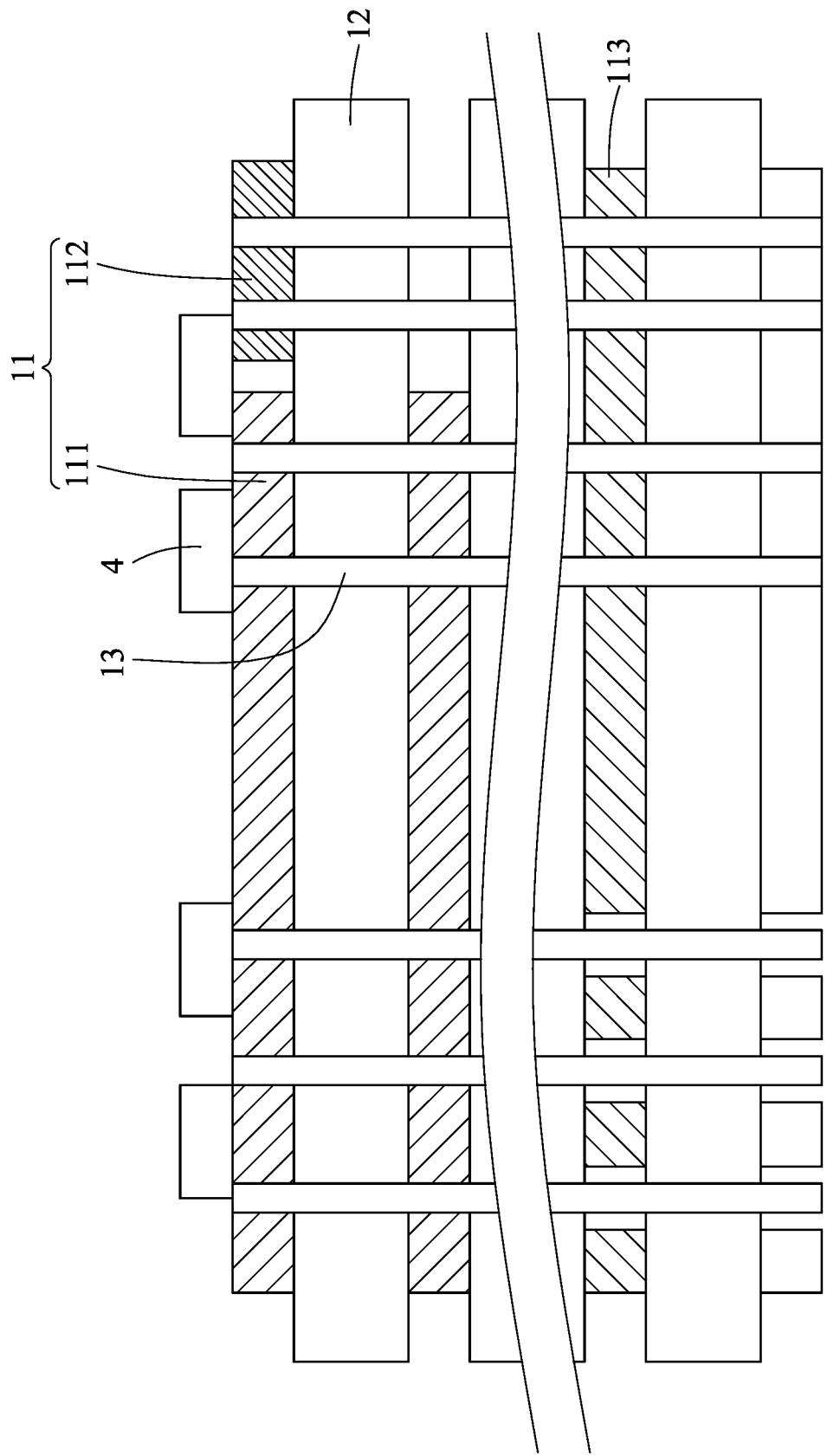
FIG. 3 is a schematic side view illustrating a multilayer PCB of the durable memory device according to the embodiment of the present invention.

As shown in FIG. 3, in the durable memory device 100 according to the embodiment of the present invention, the circuit layers 11 of the multilayer PCB 1 includes a power ground (PGND) 111, an analog ground (AGND) 112 and a common ground 113. The anti-sulfuration-and-anti-high-voltage passive component 4 is electrically connected to the power ground 111. The power ground 111 is a cooper foil, which has larger grounding area comparing with the cooper wire and has the effect of absorbing and shielding high voltage and surge. The same goes for the analog ground 112 and common ground 113.

As shown in FIG. 3, in the durable memory device 100 according to the embodiment of the present invention, the number of layers of the power ground 111 of multilayer PCB 1 is more than one, wherein multiple layers of power ground 111 are electrically connected to each other through a via 13. By the multilayer arrangement, the grounding area of the power ground 111 is further increased.

As shown in FIG. 3, in the durable memory device 100 according to the embodiment of the present invention, the power ground 111 is a ground for digital signals and the analog ground 112 is a ground for analog signals. To avoid the mutual interference between the digital signals and the analog signals, the power ground 111 and the analog ground 112 are not directly electrically connected, but are electrically connected through the common ground 113. Specifically, the power ground 111 is electrically connected to the common ground 113 through at least one via 13 of the vias 13, and the analog ground 112 is electrically connected to the common ground 113 through via 13 of the vias 13 other than said at least one via 13.

As shown in FIG. 3, in the durable memory device 100 according to the embodiment of the present invention, the insulating layers 12 include pregregs 121 and cores 122. The prepregs 121 are provided for adhering the circuit layers 11 and the cores 122.

As shown in FIG. 1, the memory member 2, the connecting interface 3, and the anti-sulfuration-and-anti-high-voltage passive component 4 are disposed on the multilayer PCB 1. The memory member 2 is a DRAM chip or flash memory chip.

As shown in FIG. 1, the connecting interface 3 is a gold finger, which is connected to a computing device when the durable memory device 100 of the present invention is inserted in the corresponding connecting portion of the computing device. The connecting interface 3 is electrically connected to the memory member 2 to transmit signals between the computing device and the memory member 2. In the present embodiment, the durable memory device 100 is a solid-state drive employing M.2 specification. And the corresponding connecting portion of the computing device is a M.2 slot.

Figure 4:
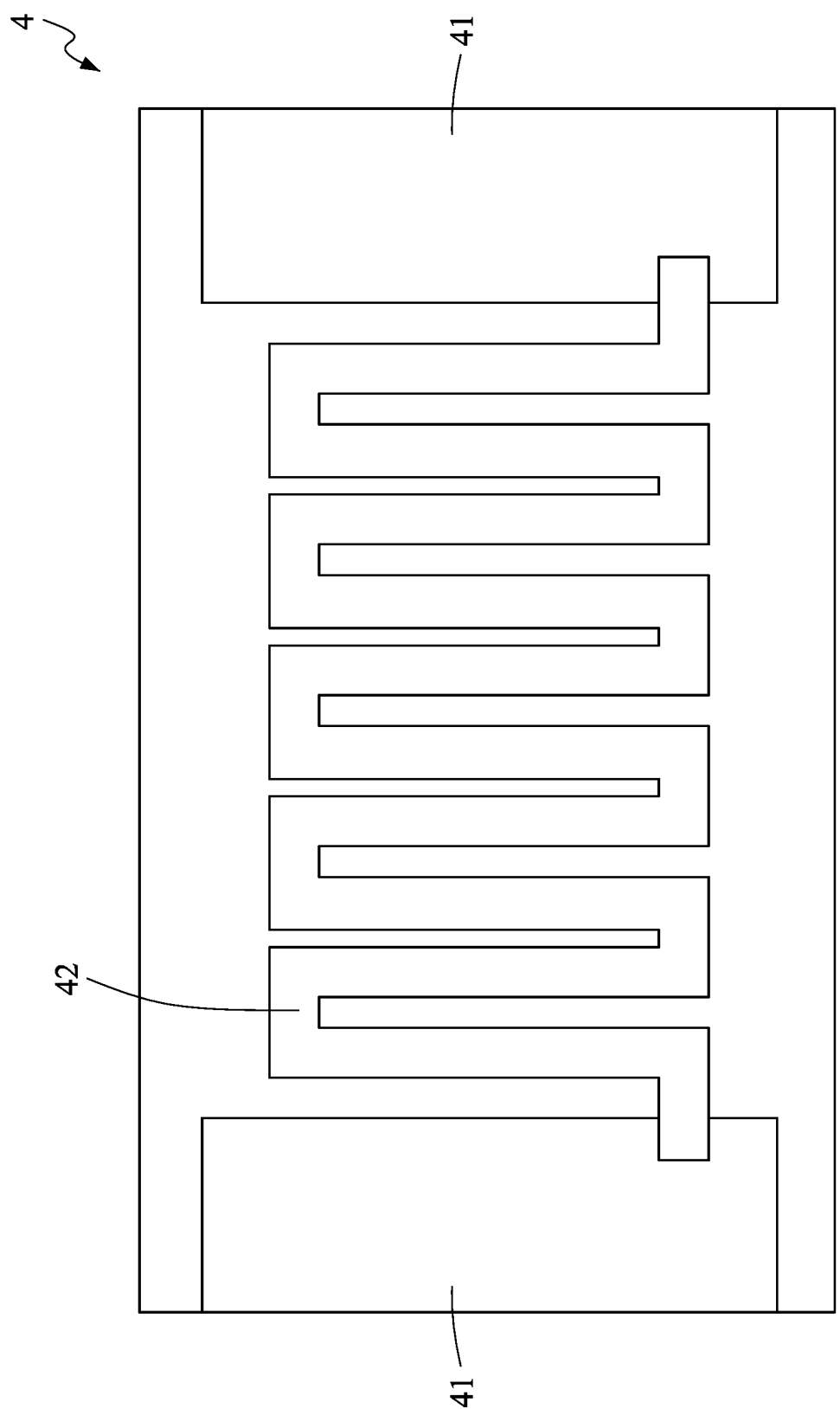
FIG. 4 is a schematic cross-section view illustrating the anti-sulfuration-and-anti-high-voltage passive component of the durable memory device according to the embodiment of the present invention.

The anti-sulfuration-and-anti-high-voltage passive component 4 is electrically connected to the connecting interface 3 and the memory member 2. As shown in FIG. 4, the anti-sulfuration-and-anti-high-voltage passive component 4 is modified based on the anti-sulfurization passive component, which alters the conductive path between the electrical terminals to a winding path to disperse high potential energy of the high-voltage surge to a larger extent, and the slight inclined potential energy is obtained to avoid component failure. Thereby, the durable memory device 100 of the present invention is durable for outdoor use. In detail, the anti-vulcanization-and-anti-high-voltage passive component 4 is an anti-sulfurization and high-voltage resistor.

In addition, as shown in FIG. 1, in the durable memory device 100 according to the embodiment of the present invention, the number of the anti-sulfuration-and-anti-high-voltage passive component 4 is more than one. In detail, all resistors of the circuit layer 11 in the present invention are anti-sulfuration-and-anti-high-voltage passive components 4. In other embodiments, all resistor networks in the durable memory device are anti-sulfuration-and-anti-high-voltage passive components.

Apart from this, as shown in FIG. 1, in the durable memory device 100 according to the embodiment of the present invention, the multilayer PCB 1 is further provided with anti-high-voltage capacitor 5. The anti-high-voltage capacitor 5 is electrically connected to the memory member 2 and the connecting interface 3. In detail, all capacitors of the durable memory device 100 in the present invention are anti-high-voltage capacitors 5.

With the above structure, the multilayer PCB 1, the anti-sulfuration-and-anti-high-voltage passive component 4, and the anti-high-voltage capacitor 5 have protective effect against high-voltage surges and signal interferences, so as to reduce the chance of mutual interference and electric-conduction, which makes the durable memory device 100 of present invention durable for outdoor use.

The above description should be considered as only the discussion of the preferred embodiments of the present invention. However, a person having ordinary skill in the art may make various modifications without deviating from the present invention. Those modifications still fall within the scope of the present invention.

What is claimed is:

1. A durable memory device, which is a main memory or a solid-state drive, the durable memory device comprising:
a multilayer PCB including a plurality of circuit layers and a plurality of insulating layers, each circuit layer and each insulating layer being alternately arranged with each other, each circuit layer being provided with a via through which the plurality of circuit layers are electrically connected, at least one of the circuit layers being functioned as a ground layer;

a memory member which is disposed at the multilayer PCB;

a connecting interface which is disposed at the multilayer PCB and is electrically connected to the memory member, the connecting interface being provided to connect to a corresponding connecting portion of a computing device; and an anti-sulfuration-and-anti-high-voltage passive component which is disposed at the multilayer PCB and is electrically connected to the memory member and the connecting interface, wherein a winding conductive path is provided to electrically connect between electrical terminals of the anti-sulfuration-and-anti-high-voltage passive component.

2. The durable memory device of claim 1, wherein the anti-sulfuration-and-anti-high-voltage passive component is an anti-sulfuration-and-anti-high-voltage resistor.

3. The durable memory device of claim 1, wherein the multilayer PCB is an eight-layer PCB or a ten-layer PCB.

4. The durable memory device of claim 1, wherein the ground layer of the multilayer PCB includes a power ground, the anti-sulfuration-and-anti-high-voltage passive component is electrically connected to the power ground.

5. The durable memory device of claim 4, wherein the ground layer of the multilayer PCB includes an analog ground and a common ground, the power ground is electrically connected to the common ground through at least one via of the vias, the analog ground is electrically connected to the common ground through via of the vias other than said at least one via.

6. The durable memory device of claim 1, further comprising an anti-high-voltage capacitor, which is disposed at the multilayer PCB and is electrically connected to the connecting interface and the memory member.

7. The durable memory device of claim 1, wherein the number of the anti-sulfuration-and-anti-high-voltage passive component is more than one.

8. The durable memory device of claim 1, wherein the durable memory device is a main memory.

9. The durable memory device of claim 1, wherein the durable memory device is a solid-state drive.

* * * * *